United States Patent
Kawamura et al.

(10) Patent No.: US 9,481,804 B2
(45) Date of Patent: Nov. 1, 2016

(54) ELECTROCONDUCTIVE INK COMPOSITION

(71) Applicant: DAISO CO., LTD., Osaka (JP)

(72) Inventors: Kensuke Kawamura, Osaka (JP); Hideaki Umakoshi, Osaka (JP)

(73) Assignee: OSAKA SODA CO., LTD., Osaka (JP)

( * ) Notice: Subject to any disclaimer, the term of this patent is extended or adjusted under 35 U.S.C. 154(b) by 99 days.

(21) Appl. No.: 14/394,766

(22) PCT Filed: Apr. 15, 2013

(86) PCT No.: PCT/JP2013/061166
§ 371 (c)(1),
(2) Date: Oct. 16, 2014

(87) PCT Pub. No.: WO2013/157514
PCT Pub. Date: Oct. 24, 2013

(65) Prior Publication Data
US 2015/0083474 A1    Mar. 26, 2015

(30) Foreign Application Priority Data
Apr. 16, 2012 (JP) .................. 2012-092670

(51) Int. Cl.
*C09D 11/52* (2014.01)
*H05K 1/09* (2006.01)
*C09D 11/033* (2014.01)
*C09D 11/037* (2014.01)

(52) U.S. Cl.
CPC ............. *C09D 11/52* (2013.01); *C09D 11/033* (2013.01); *C09D 11/037* (2013.01); *H05K 1/097* (2013.01)

(58) Field of Classification Search
None
See application file for complete search history.

(56) References Cited

U.S. PATENT DOCUMENTS

2009/0191356 A1* 7/2009 Lee .................. H05K 3/102
                                                     427/535
2010/0233361 A1  9/2010 Hu et al.

FOREIGN PATENT DOCUMENTS

| JP | 2004179125 A | 6/2004 |
|---|---|---|
| JP | 2005298921 A | 10/2005 |
| JP | 2006118010 A | 5/2006 |
| JP | 2006193594 A | 7/2006 |
| JP | 2008280592 A | 11/2008 |
| JP | 2009062523 A | 3/2009 |
| JP | 2009270146 A | 11/2009 |
| JP | 2010065267 A | 3/2010 |
| JP | 2010219042 A | 9/2010 |
| JP | 2012185944 A | 9/2012 |
| JP | 2013112807 A | 6/2013 |

OTHER PUBLICATIONS

Yaws (Yaws' Handbook of Physical Properties for Hydrocarbons and Chemicals. (2008) Knovel. Online version available at: http://app.knovel.com/hotlink/toc/id:kpYHPPHC0B/yaws-handbook-physical/yaws-handbook-physical ; which is attached as a PDF pp. 1-5.*
Barton, "Solubility Parameters", Chemical Reviews, 1975, vol. 75, No. 6, pp. 731-753; attached as a PDF.*
Azo Materials, "Thermoplastics—An Introduction"; date added online is Feb. 14, 2001 at http://www.azom.com/article.aspx?ArticleID=83 ; attached to the case file as a PDF, pp. 1-4.*
International Search Report in corresponding PCT/JP2013/061166 dated Jul. 23, 2013.
Written Opinion in corresponding PCT/JP2013/061166 dated Jul. 23, 2013.
International Preliminary Report on Patentability in corresponding PCT/JP2013/061166 dated Oct. 21, 2014.

* cited by examiner

*Primary Examiner* — Mark Kopec
*Assistant Examiner* — Katie L Hammer
(74) *Attorney, Agent, or Firm* — Marshall, Gerstein & Borun LLP

(57) ABSTRACT

An electroconductive ink composition comprising silver particles (A), a compound having a siloxane backbone with a functional group (B), and an organic solvent (C), the silver particles (A) having a protective layer containing an amino group-containing compound and having a mean particle size of 1 nm or more and 100 nm or less, the content of the compound (B) being 4% by weight to 8% by weight based on the total amount of the composition, can form a circuit pattern on a polymer film with low heat resistance, and the obtained circuit pattern has excellent adhesion to a substrate and high conductivity.

18 Claims, No Drawings

ELECTROCONDUCTIVE INK
COMPOSITION

TECHNICAL FIELD

The present invention relates to an electroconductive ink composition, more particularly to an electroconductive ink composition with which, for example when a conductive circuit pattern is formed on a low heat-resistant film substrate, such as a polymer film made of a resin with a glass transition temperature of 100° C. or less, high electrical conductivity and excellent adhesion to the substrate can be achieved as a result of heat treatment at a low temperature not higher than e.g. 120° C. alone and which is suitable for mass production of a circuit pattern. The present invention also relates to a conductive circuit pattern obtained by applying the electroconductive ink composition onto a substrate and performing heat treatment.

BACKGROUND ART

In recent years, "printed electronics", which is a technique for forming a circuit (patterning) by printing on a resin substrate having particularly high flexibility, is attracting attention as the next-generation industrial infrastructure replacing the semiconductor industry. This technique is applicable to from basic circuit components such as a thin-film transistor, a resistor, an inductor, and a capacitor, to a cell, a display, a sensor, a radio frequency identification (RFID) tag, a solar cell, etc. The technique is expected to dramatically simplify manufacturing processes of electronic products or the like, shorten the manufacturing time, and simultaneously achieve savings in energy and resources.

Personal digital assistants among electronic products have remarkably spread, and enhancement in the performance of the devices have led to increases in the size and weight thereof. Accordingly, reducing the weight of personal digital assistants is strongly demanded in the market. Moreover, since the thickness of personal digital assistants has become thin in response to the demand for weight reduction and quality design, glass used for the display, the sensor or the like are easily damaged when dropped. Thus improvement in durability has become an issue. To solve the problems, constituent parts of the personal digital assistants have been reviewed and material with high impact resistance has increasingly been adopted. However, no fundamental solution has yet been found. Consequently, a lightweight and flexible polymer film or the like has been promoted to be used in place of conventional printed circuit substrates and glass substrates among materials which constitute personal digital assistants.

In order to use a polymer film substrate for personal digital assistants, an electrical wiring is required to be formed on the polymer film surface. The electric wiring pattern formed on a polymer film surface is required to have high conductivity, adhesion to a substrate, and flexibility, and also be able to form a fine circuit pattern.

Generally, methods for forming a conductive circuit pattern on a polymer film substrate include an electroplating method, an electroless plating method, a vapor deposition method such as sputtering, and a method in which a conductive paste is applied. However, the electroplating method and the electroless plating method, in which a large amount of solvent is used, are costly in terms of waste liquid treatment. The vapor deposition method such as sputtering is also costly not only because a large-scale apparatus is required but also because etching for removal of unnecessary parts is required after vapor deposition onto the entire substrate.

Other methods for forming a circuit pattern include a method in which a conductive ink or paste of the baking type or the thermosetting type is used. In the method using a baking-type ink or paste, conductivity is imparted by removing a solvent and a binder component by heating generally at a high temperature of 200° C. or more to sinter conductive particles or bring them into contact with each other. In the method using a thermosetting-type conductive ink or paste, conductivity is imparted by curing a composition containing conductive particles and a thermosetting resin as a binder component to bring the conductive particles in the cured material into contact with each other.

In the method using a baking-type ink or paste, since a conductive particle component exists alone in the cured material, low resistivity can be obtained. However, there is no chemical bond at the interface between the cured material and a substrate, and adhesion to the substrate is likely to be low. In particular, when a circuit pattern is formed on a substrate comprising materials with low surface tension such as indium tin oxide (ITO), adhesion is significantly low.

As a material of the substrate, a multilayer substrate obtained by a build-up method is used for a lighter weight than conventional printed circuit substrates. However, a build-up method requires complicated processes. A flexible printed circuit substrate is light in weight, superior in flexibility, and also excellent in heat resistance, but is costly because polyimide is used as a material thereof. Polyamide and polyester are examples of cheaper film materials, but they are thermoplastic resins with low heat resistance. Therefore a conventional conductive paste, which needs high temperature treatment, is difficult to be used thereon.

A conductive circuit may also be formed directly on a glass surface of apart such as a display, which requires transparency and good design. Glass is excellent in heat resistance, but not satisfactory in weight, flexibility, and impact resistance. Although there seems to be a demand for a transparent plastic material like polymethylmethacrylate in place of glass for a part requiring transparency and good design, a transparent plastic material cannot replace glass in terms of heat resistance as previously mentioned.

CITATION LIST

Patent Literature

PTL 1: JP 2006-193594 A
PTL 2: JP 2009-062523 A

SUMMARY OF INVENTION

Technical Problem

The present invention provides an electroconductive ink composition capable of forming a conductive circuit pattern even on a polymer film substrate made of a thermoplastic resin having comparatively low heat resistance, the conductive circuit pattern having excellent adhesion to a substrate and high conductivity.

The present invention also provides a conductive circuit pattern which can be formed even on a polymer film substrate made of a thermoplastic resin having comparatively low heat resistance, the conductive circuit pattern having excellent adhesion to a substrate and high conductivity.

Solution to Problem

To solve the above problems, the present inventors carried out further studies, and found that, when an electroconductive ink composition comprises silver particles (A) having a mean particle size of 1 nm or more and 100 nm or less and having a protective layer containing an amino group-containing compound, a compound having a siloxane backbone with a functional group (B), and an organic solvent (C), and the content of the compound (B) is about 4% by weight to 8% by weight relative to the total amount of the composition, or about 5 parts by weight to 13 parts by weight relative to 100 parts by weight of the silver particles (A), a conductive circuit pattern formed using the electroconductive ink composition and subjected to heat treatment at a relatively low temperature has excellent adhesion to a substrate and high conductivity.

The present invention was completed based on the above-mentioned findings, and provides the following electroconductive ink compositions and conductive circuit pattern.

(1) An electroconductive ink composition comprising silver particles (A), a compound having a siloxane backbone with a functional group (B), and an organic solvent (C), the silver particles (A) having a protective layer containing an amino group-containing compound and having a mean particle size of 1 nm or more and 100 nm or less, the content of the compound (B) being 4% by weight to 8% by weight based on the total amount of the composition.

(2) The electroconductive ink composition according to the above (1), wherein the protective layer of the silver particles (A) comprises, as the amino group-containing compound, an amino group-containing compound (a-1) having a boiling point of less than 100° C. and an amino group-containing compound (a-2) having a boiling point of 100° C. or more, and the weight ratio (a-1:a-2) is in the range of 15:85 to 70:30.

(3) The electroconductive ink composition according to the above (1) or (2), wherein the functional group of the compound having a siloxane backbone with a functional group (B) is one or more selected from the group consisting of an amino group, an isocyanate group, a cyano group, a vinyl group, an epoxy group, and a mercapto group.

(4) The electroconductive ink composition according to any one of the above (1) to (3), wherein the organic solvent (C) has a solubility parameter (SP value) of 12 $(cal/cm^3)^{1/2}$ or less.

(5) An electroconductive ink composition comprising silver particles (A), a compound having a siloxane backbone with a functional group (B), and an organic solvent (C), the silver particles (A) having a protective layer containing an amino group-containing compound and having a mean particle size of 1 nm or more and 100 nm or less, the content of the compound (B) being 5 parts by weight to 13 parts by weight based on 100 parts by weight of the silver particles (A).

(6) The electroconductive ink composition according to any one of the above (1) to (5), wherein the electroconductive ink composition is for a polymer film made of a polymer with a glass transition temperature of 100° C. or less.

(7) The electroconductive ink composition according to the above (6), wherein the surface of the polymer film is coated with a ceramic or a metal.

(8) A conductive circuit pattern formed using the electroconductive ink composition according to any one of the above (1) to (5).

Advantageous Effects of Invention

When the electroconductive ink composition of the present invention is used, heat treatment needed for circuit pattern formation on a substrate may be performed at a relatively low temperature, e.g. 120° C. or less. Therefore, even on a thermoplastic polymer film with relatively low heat resistance and, for example, a glass transition temperature of 100° C. or less, a circuit pattern can be formed without causing deformation of the substrate such as thermal shrinkage.

Furthermore, a circuit pattern formed using the electroconductive ink composition of the present invention is excellent in adhesion to the substrate. For example, using the electroconductive ink composition of the present invention, a circuit pattern with good adhesion can be formed even on a substrate surface made of a low surface tension ceramic material such as indium tin oxide (ITO) although, in general, adhesion between a circuit pattern and a substrate having such a surface is likely to be poor.

The circuit pattern formed using the electroconductive ink composition of the present invention has also sufficiently high resistivity for practical use.

DESCRIPTION OF EMBODIMENTS

The present invention is explained in detail as follows.
Electroconductive Ink Composition The electroconductive ink composition of the present invention comprises silver particles (A) having a mean particle size of 1 nm or more and 100 nm or less and having a protective layer containing an amino group-containing compound, a compound having a siloxane backbone with a functional group (B) and an organic solvent (C).

In one aspect of the composition of the present invention, the content of the compound having a siloxane backbone with a functional group (B) can be about 4% by weight to 8% by weight based on the total amount of the composition. In another aspect, the content of the compound having a siloxane backbone with a functional group (B) can be about 5 parts by weight to 13 parts by weight based on 100 parts by weight of the silver particles (A).

Silver Particles (A)

The silver particles (A) in the electroconductive ink composition of the present invention can be used without any particular limitation as long as the silver particles have a mean particle size of about 1 nm to 100 nm and have a protective layer containing an amino group-containing compound.

The mean particle size of the silver particles (A) is preferably about 1 nm to 50 nm, and more preferably about 5 nm to 30 nm. Silver particles (A) having a mean particle size in the above range are less likely to be aggregated and are dispersed homogeneously in the organic solvent (C) when used. Furthermore, such silver particles are favorably sintered at low temperature since the volume per weight of the protective layer is not excessive as compared to the volume per weight of the silver.

In the present invention, the mean particle size is a value measured by the dynamic light scattering, and, specifically, a value measured by Zetasizer Nano made by Spectris.

The silver particles (A) can also be a combination of two or more kinds of silver particles with different mean particle sizes in the above-mentioned range.

The shape of the silver particles (A) is not particularly limited as long as the intended conductivity is obtained. A spherical particle and a cylindrical particle exemplify the shape, and several different shapes of particles can be mixed and used.

The silver particles (A) having a mean particle size of 100 nm or less tend to be aggregated due to their high surface energy. For this reason, each particle needs to have a protective layer on the surface thereof to prevent aggregation in the electroconductive ink composition. The protective layer is simply required to contain an amino group-containing compound, and can contain, without any limitation, other compounds usually used for a protective layer of the silver particles (A) in a range such that the compounds do not affect the effects of the present invention. Preferably, the protective layer can be promptly removed and eliminated from the silver particles and the composition of the present invention by heat treatment such as drying performed after the application of the composition of the present invention onto a substrate.

The content of the compound which contains an amino group in the protective layer is preferably 80% by weight or more, more preferably 90% by weight or more, and further more preferably 95% or more, each based on the total amount of the protective layer. The protective layer may consist of the amino group-containing compound only.

The amino group-containing compound contained in the protective layer of the silver particles (A) preferably comprises both an amino group-containing compound (a-1) having a boiling point at normal pressure of less than 100° C. and an amino group-containing compound (a-2) having a boiling point at normal pressure of 100° C. or more in order that the silver particles (A) in the electroconductive ink composition can have excellent dispersibility and that the protective layer can be easily removed and eliminated by heat treatment such as drying performed after the application of the composition onto a substrate.

The weight ratio (a-1:a-2) of the amino group-containing compound (a-1) having a boiling point at normal pressure of less than 100° C. and the amino group-containing compound (a-2) having a boiling point at normal pressure of 100° C. or more in the protective layer is preferably about 15:85 to 70:30, and more preferably about 30:70 to 60:40. As long as the ratio is in the above range, the silver particles (A) in the electroconductive ink composition can be sufficiently well dispersed, and the protective layer can be easily removed and eliminated by heat treatment.

Examples of the amino group-containing compound (a-1) having a boiling point at normal pressure of less than 100° C. include ethylamine, n-propylamine, isopropylamine, 1,2-dimethyl propylamine, n-butylamine, isobutylamine, sec-butylamine, tert-butylamine, isoamylamine, tert-amylamine, 3-pentylamine, and allylamine. Among them, n-propylamine, n-butylamine, isobutylamine, sec-butylamine, and tert-butylamine are preferred.

Examples of the amino group-containing compound (a-2) having a boiling point at normal pressure of 100° C. or more include amine compounds such as n-amylamine, n-hexylamine, n-heptylamine, n-octylamine, 2-octylamine, 2-ethylhexylamine, n-nonylamine, n-aminodecane, n-aminoundecane, n-dodecylamine, n-tridecylamine, 2-tridecylamine, n-tetradecylamine, n-pentadecylamine, n-hexadecylamine, n-heptadecylamine, n-octadecylamine, n-oleylamine, N-ethyl-1,3-diaminopropane, N,N-diisopropylethylamine, N,N-dimethylaminopropane, N,N-dibutylaminopropane, N,N-diisobutyl-1,3-diaminopropane, and N-lauryl diaminopropane. Among them, n-hexylamine, n-octylamine, 2-ethylhexylamine, n-dodecylamine, n-oleylamine, and N,N-dimethylaminopropane are preferred.

The difference between the boiling points of the amino group-containing compound (a-1) having a boiling point at normal pressure of less than 100° C. and the amino group-containing compound (a-2) having a boiling point at normal pressure of 100° C. or more is preferably 50° C. or more, and more preferably 70° C. or more. The difference is also preferably 220° C. or less, and more preferably 200° C. or less. As long as the difference is in the mentioned range, the silver particles (A) in the electroconductive ink composition can be better dispersed, and the protective layer can be more easily removed and eliminated by heat treatment.

In order to improve the stability of the silver particles (A) in the electroconductive ink composition, the protective layer of the silver particles (A) may contain a compound containing a carboxyl group, a thiol group, an aldehyde group, a cyano group or an isocyanate group; a compound containing a ketone structure, an amide structure or an ester structure; or a compound containing two or more selected from these groups and structures in addition to the amino group-containing compound.

Examples of the carboxyl group-containing compound include acetic acid, propionic acid, butyric acid, valeric acid, caproic acid, caprylic acid, 2-ethylhexanoic acid, capric acid, lauric acid, myristic acid, palmitic acid, stearic acid, oleic acid, linoleic acid, linolenic acid, oxalic acid, malonic acid, succinic acid, glutaric acid, adipic acid, fumaric acid, maleic acid, citric acid, and 1,2,3-propane tricarboxylic acid.

Examples of the aldehyde group-containing compound include formaldehyde, acetaldehyde, propionaldehyde, acrolein, benzaldehyde, cinnamaldehyde, and perillaldehyde.

Examples of the cyano group-containing compound include acetonitrile, benzonitrile, acrylonitrile, adiponitrile, phthalonitrile, propanenitrile, malononitrile, mandelonitrile, azobis(cyclohexanecarbonitrile), and azobisisobutyronitrile.

Examples of the isocyanate group-containing compound include monoisocyanates such as methyl isocyanate and ethyl isocyanate, and diisocyanates such as toluene diisocyanate and diphenylmethane diisocyanate.

Examples of the compound containing a ketone structure include acetone, methyl ethyl ketone, diethyl ketone, methyl propyl ketone, methyl isobutyl ketone, methyl amyl ketone, cyclohexanone, and isophorone.

Examples of the compound containing an amide structure include acetamide, N,N-dimethylformamide, and carbamide.

Examples of the compound containing an ester structure include methyl acetate, ethyl acetate, methyl salicylate, ethyl formate, ethyl butyrate, ethyl caproate, pentyl acetate, isopentyl acetate, pentyl valerate, pentyl butyrate, octyl acetate, and propylene carbonate.

The total content of these compounds is preferably about 0.5 parts by weight to 25 parts by weight, more preferably about 0.6 parts by weight to 23 parts by weight, and further more preferably about 0.7 parts by weight to 20 parts by weight, each based on 100 parts by weight of the amino group-containing compound.

The protective layer may contain, in addition to the compound for the protective purpose, compounds such as an additive which usually can be used for a protective layer in a range such that the effects of the present invention are not impaired.

As the silver particles (A), which have a protective layer containing an amino group-containing compound, commercial products are available from, for example, Daiken Chemical Co., Ltd. and Mitsuboshi Belting Ltd. Alternatively, the silver particles can be produced in accordance with the processes disclosed in JP 2009-270146 A or JP 2010-265543 A.

The content of the silver particles (A) in the electroconductive ink composition is not particularly limited, and may be appropriately selected depending on other constituents to be added in a range such that the intended conductivity can be obtained. For better conductivity of a circuit pattern and better dispersibility of the silver particles in the electroconductive ink, the better dispersibility leading to improved productivity, the content of the silver particles is, in particular, preferably about 60 parts by weight to 900 parts by weight, and more preferably about 150 parts by weight to 600 parts by weight, each based on 100 parts by weight of the organic solvent (C). The weight of the silver particles (A) contains the weight of the protective layer.

Compound Having a Siloxane Backbone with a Functional Group (B)

The compound having a siloxane backbone with a functional group (B) in the electroconductive ink composition of the present invention is used for favorable bond formation with the silver particles (A) in the electroconductive ink composition. The bonds formed between the surfaces of silver particles (A) and the functional groups of the compound (B) play an important role in adhesion between the electroconductive ink composition and the substrate.

Examples of the functional group of the compound having a siloxane backbone with a functional group (B) include a carboxyl group, a phosphino group, an isocyanate group, an amino group, a mercapto group, a cyano group, a thiocyanate group, a vinyl group, an epoxy group, a styryl group, a methacrylic group, an acrylic group, an ureido group, a glycinato group, an alkylseleno group, an alkyltelluro group, a silane group, an alcohol group, and an aldehyde group. Among them, preferred are an isocyanate group, an amino group, a mercapto group, a vinyl group, a cyano group, and an epoxy group; more preferred are an isocyanate group, an amino group, a vinyl group, a cyano group, and a mercapto group; and further more preferred are an isocyanate group, an amino group, a cyano group, and a mercapto group.

The compound having a siloxane backbone (B) may have one kind, or two or more kinds of functional groups.

Examples of the compound having a siloxane backbone with a functional group (B) include vinyltrimethoxysilane, vinyltriethoxysilane, vinyltris(2-methoxyethoxy)silane, vinylmethyldimethoxysilane, p-styryl trimethoxysilane, 3-methacryloxypropyl methyldiethoxysilane, 3-methacryloxypropyl triethoxysilane, 3-methacryloxypropyl trimethoxysilane, 3-methacryloxypropyl methyldimethoxysilane, 3-acryloxypropyl trimethoxysilane, N-(3-trimethoxysilylpropyl)ethylenediamine, 3-(triethoxysilylpropyl)isocyanate, 3-(trimethoxysilylpropyl)isocyanate, 3-mercaptopropyl triethoxysilane, 3-mercaptopropyl methyldimethoxysilane, 3-mercaptopropyl trimethoxysilane, 3-octanoylthio-1-propyltriethoxysilane, 3-(methyldimethoxysilyl)propane-1-thiol, 3-(triethoxysilyl)propylamine, 3-(trimethoxysilyl)propylamine, N-(2-aminoethyl)-3-aminopropyl trimethoxysilane, N-(2-aminoethyl)-3-aminopropyl methyldimethoxysilane, N-2-(aminoethyl)-3-aminopropyl triethoxysilane, 3-(N-phenyl)aminopropyl trimethoxysilane, 3-ureidopropyl triethoxysilane, 2-(3,4-epoxycyclohexyl)ethyltrimethoxysilane, 3-glycidoxypropyl methyldimetoxysilane, 3-glycidoxypropyl trimethoxysilane, 3-glycidoxypropyl methyldiethoxysilane, 3-glycidoxypropyl methyldiethoxysilane, and 3-glycidoxypropyl triethoxysilane, all of which are capable of forming a good bond to the silver particles (A).

The compound having a siloxane backbone with a functional group (B) can be used alone or in combination of two or more kinds thereof.

The compound having a siloxane backbone with a functional group (B) may be a commercial product or a compound synthesized through a publicly known synthesis process.

The content of the compound having a siloxane backbone with a functional group (B) in the electroconductive ink composition may be appropriately selected depending on other constituents to be added. In one aspect of the present invention, the content is, in particular, preferably about 4 parts by weight to 8 parts by weight, and more preferably about 5 parts by weight to 7 parts by weight, each based on the total amount of the electroconductive ink composition. As long as the content is in the above range, good adhesion is obtained between the circuit pattern and the substrate, and the decrease in conductivity caused by poor drying of the coating film is less likely to occur.

In another aspect of the present invention, the content of the compound having a siloxane backbone with a functional group (B) in the electroconductive ink composition is preferably 5 parts by weight or more, more preferably 6 parts by weight or more, and further more preferably 7 parts by weight or more, each based on 100 parts by weight of the silver particles (A). As long as the content is in the above range, good adhesion is obtained between the circuit pattern and the substrate.

The content of the compound having a siloxane backbone with a functional group (B) in the electroconductive ink composition is preferably 13 parts by weight or less, more preferably 12 parts by weight or less, and further more preferably 11 parts by weight or less, each based on 100 parts by weight of the silver particles (A). As long as the content is in the above range, the decrease in conductivity caused by poor drying of the coating film is less likely to occur.

The content of the compound having a siloxane backbone with a functional group (B) in the electroconductive ink composition based on 100 parts by weight of the silver particles (A) may be about 5 parts by weight to 13 parts by weight, about 5 parts by weight to 12 parts by weight, about 5 parts by weight to 11 parts by weight, about 6 parts by weight to 13 parts by weight, about 6 parts by weight to 12 parts by weight, about 6 parts by weight to 11 parts by weight, about 7 parts by weight to 13 parts by weight, about 7 parts by weight to 12 parts by weight or about 7 parts by weight to 11 parts by weight.

Organic Solvent (C)

As the organic solvent (C) in the electroconductive ink composition of the present invention, any solvent can be used without any particular limitation as long as it allows individual constituents to be homogeneously dispersed in the electroconductive ink composition. Examples of the organic solvent (C) include alcohols such as methanol, ethanol, 1-propanol, 2-propanol, 1-butanol, 2-butanol, cyclohexanol, and ethylene glycol; hydrocarbons such as hexane, cyclohexane, cyclohexanone, heptane, octane, nonane, decane, undecane, dodecane, tridecane, tetradecane, pentadecane, hexadecane, heptadecane, octadecane, benzene, toluene, ethylbenzene, xylene, styrene monomer, and mineral spirits; esters such as ethyl acetate, butyl acetate, propyl acetate, isobutyl acetate, ethylene glycol monomethyl ether acetate, and ethylene glycol monoethyl ether acetate; ketones such as acetone, methyl ethyl ketone, and methyl isobutyl ketone; glycol ethers such as ethylene glycol monoethyl ether, ethylene glycol monomethyl ether, ethylene glycol dimethyl ether, diethylene glycol dimethyl ether, and triethylene glycol dimethyl ether; terpineol; pinene; limonene; menthane; cymene; and isophorone.

The organic solvent (C) may be one kind or a combination of two or more kinds of such solvents.

Among the solvents, for uniform dispersion of the silver particles, suitably used is an organic solvent with a solubility parameter (SP value) of 12 $(cal/cm^3)^{1/2}$ or less, and more preferred is one with a solubility parameter of 10 $(cal/cm^3)^{1/2}$ or less. Specifically, hexane (SP value: 7.3), cyclohexane (SP value: 8.2), cyclohexanone (SP value: 9.9), octane (SP value: 7.5), toluene (SP value: 8.8), xylene (SP value: 8.8), methyl ethyl ketone (SP value: 9.3), methyl isobutyl ketone (SP value: 8.4), ethylene glycol monoethyl ether (SP value: 10.5), cyclohexanol (SP value: 11.4), terpineol (SP value: 11.1), octanol (SP value: 10.3), n-butyl alcohol (SP value: 11.4) or the like can be used suitably.

Moreover, a mixed solvent with a solubility parameter (SP value) of 12 $(cal/cm^3)^{1/2}$ or less prepared by mixing two or more kinds of organic solvents can also be used suitably. For example, a mixed solvent with a solubility parameter (SP value) of 12 $(cal/cm^3)^{1/2}$ or less prepared by mixing an organic solvent with a solubility parameter (SP value) of 12 $(cal/cm^3)^{1/2}$ or more and one with a solubility parameter (SP value) of 12 $(cal/cm^3)^{1/2}$ or less in a ratio to provide a solvent with the desired SP value can be used.

The solubility parameter (SP value) of a solvent and the solubility parameter (SP value) of a mixed solvent can be obtained through the process described in Chem. Rev., 75 (6), 731-753(1975).

The content of the organic solvent (C) in the electroconductive ink composition can be appropriately selected depending on other constituents to be added. When the content of the organic solvent (C) is extremely insufficient, individual constituents cannot be dispersed homogeneously and appropriate film formation cannot be achieved in the attempt of conductive circuit pattern formation. Consequently, the conductivity of the circuit pattern decreases. When the content of the organic solvent (C) is extremely excessive, dispersing behavior of the silver particles may change, causing aggregation of the particles, and a sufficient film thickness cannot be achieved in the attempt of conductive circuit pattern formation. Consequently, the conductivity of the circuit pattern decreases. Therefore, the content of the organic solvent (C) is preferably in a range such that the individual constituents in the electroconductive ink composition are well dispersed and a coating film with an appropriate thickness is formed at the time of conductive circuit pattern formation. Specifically, the content may be in the range of, for example, about 2% by weight to 58% by weight, and preferably about 4% by weight to 36% by weight, based on the total weight of the electroconductive ink composition. The content of the organic solvent can be appropriately selected depending on a method for forming a conductive circuit pattern.

Other Constituents

To the electroconductive ink composition of the present invention, additives such as a viscosity modifier, a conductive assistant, an anti-choking agent, an antioxidant, an acidity regulator, an anti-drying agent, an adhesion imparting agent, a preservative, a defoamer, and a leveling agent, which are usually added to electroconductive ink compositions, may be added as needed in a range such that the effects of the present invention are not impaired.

A viscosity modifier among the above additives can be used for viscosity adjustment to give a composition applicable to various printing methods. A conductive assistant can be added to achieve still higher conductivity.

As a viscosity modifier, when high viscosity is required, various polymers such as a vinyl chloride-vinyl acetate copolymer resin, a polyester resin, an acrylic resin, and a polyurethane resin, polysaccharides such as carboxymethyl cellulose, sugar fatty acid esters such as dextrin palmitate, metallic soaps such as zinc octoate, swelling clay minerals such as a smectite, spike lavender oil, petrol, which is a mineral oil extracted from petroleum, or the like can be used.

When low viscosity is required, a leveling agent, a surface tension adjuster, a reducer or the like can be used. It is desirable that such viscosity modifiers, which inhibit the sintering reaction of the silver particles (A), can be volatilized at the time of drying. When using a high molecular weight substance as a viscosity modifier, or when using a large amount of viscosity modifier, the drying temperature of about 100° C. is not likely to sufficiently remove the viscosity modifier by evaporation. For this reason, the amount of the viscosity modifier to be added should be minimized depending on the molecular weight thereof. Thus, the addition amount of the viscosity modifier in the electroconductive ink composition is preferably 7 parts by weight or less, and more preferably 5 parts by weight or less, each based on 100 parts by weight of the organic solvent (C).

Preparation Process of Electroconductive Ink Composition

The electroconductive ink composition of the present invention can be prepared by mixing the constituents. Although the order of mixing the constituents is not particularly limited, for better workability, preferably the silver particles (A) and the compound having a siloxane backbone with a functional group (B) are added to the organic solvent (C), and the constituents were mixed by the process usually used.

In the case where an additive is added, the silver particles (A), the compound having a siloxane backbone with a functional group (B), and the additive may be added to the organic solvent (C). Alternatively, after mixing the organic solvent (C), the silver particles (A), and the compound having a siloxane backbone with a functional group (B), the additive may be added to the mixture.

In the case where a viscosity modifier is added to the electroconductive ink composition, the viscosity modifier is added to and mixed with the organic solvent (C), and then the silver particles (A) and the compound having a siloxane backbone with a functional group (B) are added to and mixed with the solvent to give an electroconductive ink composition in which the constituents are dispersed homogeneously.

The method for mixing the constituents of the electroconductive ink composition is not particularly limited as long as individual constituents of the electroconductive ink composition can be dispersed and mixed homogeneously. Specifically, examples of the mixing method include methods using a mechanical stirrer, a magnetic stirrer, an ultrasonic dispersing machine, a planetary mill, a ball mill, a three roll mill or the like. A planetary mill is preferably used for better homogeneity of the resulting electroconductive ink composition and for easy operability. Mixing conditions may be appropriately selected from the conditions usually used.

Use of Electroconductive Ink Composition

The electroconductive ink composition of the present invention having an appropriately adjusted viscosity can be used for the formation of any conductive circuit pattern on a substrate with use of a standard general-purpose machine without the need for any particular substrate or technique.

As a substrate used for forming a conductive circuit pattern, a substrate material with low heat resistance such as a polymer film made of a thermoplastic resin having a glass transition temperature (Tg) of 100° C. or less can be used, for example. Specifically, examples of the substrate include polyamides such as Nylon 6,6 (Tg=49° C.), polyesters such as polyethylene terephthalate (Tg=70° C.), and polymer films such as polypropylene (Tg=−20° C. to 0° C.), polyvinyl chloride (Tg=80° C.), and polystyrene (Tg=95° C.). Furthermore, the above polymer films whose surfaces are coated with a ceramic like indium tin oxide (ITO) or a metal can also be used suitably.

Examples of the process for forming a conductive circuit pattern include a discharging method and a printing method. Examples of the discharging method include an ink jet method and a dispensing method. Examples of the printing method include, besides screen printing, rotary printings such as flexographic printing, offset printing, gravure printing, and gravure offset printing.

The organic solvent (C), the protective layer on the surface of the silver particles (A) or the like may be removed by heat drying after application of the conductive circuit pattern. As the method of the heat treatment, methods capable of efficiently heating the applied conductive circuit pattern can be used. Examples of the method include a heating method using a drying oven where heated gas is circulated or convected in the atmosphere or a desired atmosphere, a heating method using electromagnetic waves radiated from an infrared heater or the like, and a heating method by contact of a heated metal or ceramic with the polymer film. The drying temperature may be appropriately selected depending on the organic solvent (C) to be used and on the heat-resistant temperature of the substrate, and can be, for example, about 60° C. or more and about 200° C. or less, particularly 160° C. or less, and more particularly 120° C. or less.

The sintering reaction of the silver particles (A) may be performed simultaneously by the heat drying.

After the electroconductive ink composition of the present invention is applied onto the substrate and dried, normally heat treatment (sintering reaction) is preferably performed to promote sintering of the silver particles (A). The purpose of the heat treatment is to achieve low resistivity by removing, through volatilization or the like, the other constituents in the electroconductive ink composition applied onto the substrate than the silver particles (A) and sintering the silver particles (A) in direct contact with each other as a result of the removal.

The sintering temperature depends on the silver particles (A) and the composition of the protective layer of the silver particles (A), and is required to be a temperature at which the constituents other than the silver particles (A) can be removed by volatilization and the thermal deformation of the polymer film used as a substrate does not occur. For example, the sintering temperature can be about 40° C. or more and about 120° C. or less, particularly about 110° C. or less, and more particularly about 100° C. or less. The sintering time is preferably about 5 minutes to 120 minutes. The conductive circuit pattern obtained by heat treatment under the above-mentioned conditions has sufficient conductivity and high substrate adhesion.

In the sintering reaction, the constituents other than the silver particles (A) are required to be removed not necessarily completely but to an extent where sufficient conductivity is obtained while adhesion to the substrate is maintained.

The use of the electroconductive ink composition of the present invention can prevent the influence of the shrinkage of a film caused by heat treatment, and therefore the electroconductive ink composition can be suitably used for the formation of a conductive circuit pattern on substrates such as a flexible circuit substrate, a touch panel substrate, and a substrate for a display device, which are susceptible to the influence of a positional displacement of a printing pattern.

EXAMPLES

The present invention is described in detail below with reference to Examples. However, the present invention is not limited to them.

(1) Preparation of Electroconductive Ink Composition

Constituents used for preparation of the composition of Examples and Comparative Examples are shown below.

Silver Particle (A)

The silver particles M1 and M2 having a protective layer were produced through the process described in JP 2009-270146 A.

The mean particle size of the obtained silver particles, the compounds contained in the protective layer, and the contents of the compounds are as follows. Reagents supplied by Wako Pure Chemical Industries, Ltd. were used. The mean particle size was measured with Zetasizer Nano (Spectris).

M1:
Silver particle (mean particle size: 21 nm);
oleic acid (1% by weight based on the total amount of the protective layer),
n-dodecylamine (10% by weight based on the total amount of the protective layer),
n-octylamine (74% by weight based on the total amount of the protective layer), and
n-butylamine (15% by weight based on the total amount of the protective layer)

M2:
Silver particle (mean particle size: 21 nm);
oleic acid (1% by weight based on the total amount of the protective layer),
n-octylamine (49% by weight based on the total amount of the protective layer), and
n-butylamine (50% by weight based on the total amount of the protective layer)

M3:
Silver particle (mean particle size: 21 nm);
oleic acid (30% by weight based on the total amount of the protective layer) and
caprylic acid (70% by weight based on the total amount of the protective layer)

Compound Having a Siloxane Backbone with a Functional Group (B)

The following were used as the compound having a siloxane backbone with a functional group (B).

B1: Vinyltriethoxysilane (manufactured by Tokyo Chemical Industry Co., Ltd.)
B2: 3-(Triethoxysilyl)propylamine (manufactured by Tokyo Chemical Industry Co., Ltd.)

Moreover, the undermentioned compound B3, which has a similar structure, was used for comparison.

B3: Titanium tetra-n-butoxide (manufactured by Matsumoto Fine Chemical Co., Ltd.)

Organic Solvent (C)

The following were used as the organic solvent (C).
S1: Cyclohexanol (SP value: 11.4)
S2: Toluene (SP value: 8.3)
S3: Hexane/2-propanol mixed solvent (3:2) (SP value: 8.5)

Process for Preparation of Electroconductive Ink Composition

The constituents were mixed to prepare electroconductive ink compositions of Examples 1 to 6 and Comparative Examples 1 to 5 having the compositions as shown in Table 1. Specifically, the silver particles (A) and the solvent (C) were placed in a container and mixed using a Mazerustar KK-2505 made by KURABO INDUSTRIES LTD. at room temperature for 1 minute. To this, the compound having a siloxane backbone with a functional group (B) was added, and additional 1-minute mixing was performed to prepare the electroconductive ink composition. In Table 1, each content of the silver particles (A) and the compound having a siloxane backbone with a functional group (B) is represented as a relative value (parts by weight) to 100 parts by weight of the organic solvent (C).

TABLE 1

| | | Example | | | | | | Comparative Example | | | | |
|---|---|---|---|---|---|---|---|---|---|---|---|---|
| | | 1 | 2 | 3 | 4 | 5 | 6 | 1 | 2 | 3 | 4 | 5 |
| (A) | M1 | 182 | 182 | | | | | | | | | |
| | M2 | | | 182 | 182 | 182 | 182 | | 182 | 182 | 182 | 182 |
| | M3 | | | | | | | 182 | | | | |
| (B) | B1 | 18 | | 18 | | | | 18 | | | | |
| | B2 | | 18 | | 18 | 18 | 18 | | | | 8 | 28 |
| | B3 | | | | | | | | 18 | | | |
| (C) | S1 | 100 | 100 | 100 | 100 | | | | | 100 | | |
| | S2 | | | | | 100 | | 100 | 100 | | 100 | 100 |
| | S3 | | | | | | 100 | | | | | |

In addition, in order to confirm that the silver particles were homogeneously dispersed without agglomeration in each prepared electroconductive ink composition, shear stress hysteresis curves were obtained using Brookfield Engineering DV-II+ Pro Cone/Plate Viscometer at a temperature of 25° C. while the rotation speed was changed, between 0.5 rpm and 100 rpm, from low to high (going) and then high to low (returning). After confirming that, at any rotation speed, the shearing stress values measured in the going and in the returning were the same, which means that the silver particles were not aggregated, the compositions were used for each of the following evaluations.

(2) Physical-Properties Evaluation (Adhesion Evaluation)

The evaluation was performed using a PET film treated by ITO sputtering (HK188G-AB500H manufactured by Teijin Chemicals Ltd.) having a size of 50 mm×50 mm as a substrate. The electroconductive ink composition was applied over the entire surface of the substrate with a spin coater and dried in the air at a temperature of 100° C. for 30 minutes to give a sample whose coating thickness after drying was 1 μm. Adhesion of the sample was tested by the method of JIS K5600 and evaluated by the number of lattice cells where the composition was not peeled off but remained when an adhesive tape was peeled off from the sample. The evaluation criteria are as follows. The results are shown in Table 2.

Excellent: 25/25 (no peeling off)
Good: not less than 23/25 and not higher than 24/25
Poor: not higher than 22/25

(Evaluation of Resistivity)

The evaluation was performed with a four-terminal conductivity meter (Loresta AX made by Mitsubishi Chemical Analytech Co., Ltd.). The electroconductive ink composition was applied over the entire surface of an adhesion-promoted PET film (HPE-50 manufactured by Teijin Chemicals Ltd.) having a size of 100 mm×100 mm with a spin coater and dried in the air at a temperature of 100° C. for 30 minutes to give a sample whose coating thickness after drying was 1 μm. Resistivity was measured in the center of the coating film of the sample. The evaluation criteria are as follows. The results are shown in Table 2.

Excellent: less than $5 \times 10^{-6}$ Ω·cm
Good: $5 \times 10^{-6}$ Ω·cm or more and less than $1 \times 10^{-5}$ Ω·cm
Poor: $1 \times 10^{-5}$ Ω·cm or more

TABLE 2

| | Example | | | | | | Comparative Example | | | | |
|---|---|---|---|---|---|---|---|---|---|---|---|
| | 1 | 2 | 3 | 4 | 5 | 6 | 1 | 2 | 3 | 4 | 5 |
| Resistivity | Good | Good | Excellent | Excellent | Excellent | Excellent | Poor | Good | Excellent | Excellent | Poor |
| Adhesion | Good | Excellent | Good | Excellent | Excellent | Excellent | Good | Poor | Poor | Poor | Excellent |

In Examples 1 to 6, good results were obtained in terms of both adhesion to the PET film and specific resistance.

In contrast, in Comparative Example 1, where silver particles whose protective layer did not contain a compound with an amino group were used, favorable resistivity was not obtained. Judging from bluish appearance of the coating film, the sintering reaction did not seem to have sufficiently proceeded, which was thought to be the reason.

In Comparative Example 2, where a different coupling agent was contained in place of the compound having a siloxane backbone with a functional group (B), the composition had no adhesion to the substrate, and almost all the lattice cells were removed. In Comparative Example 3, where no coupling agent was contained, the composition had no adhesion to the substrate, and almost all the lattice cells were removed.

In Comparative example 4, where the content of the compound having a siloxane backbone with a functional group (B) was too low (3% by weight based on the total amount of the composition and 4.4 parts by weight based on 100 parts by weight of the silver particles (A)), adhesion to the substrate was poor.

In Comparative Example 5, where the content of the compound having a siloxane backbone with a functional group (B) was too high (9% by weight based on the total amount of the composition and 15.4 parts by weight based on 100 parts by weight of the silver particles (A)), conductivity was affected, and resistivity became too high.

INDUSTRIAL APPLICABILITY

The electroconductive ink composition of the present invention can be effectively used in various fields such as conductive adhesives, electric circuit wiring, electromagnetic wave absorbers, and reflectors.

The invention claimed is:

1. An electroconductive ink composition comprising silver particles (A), a compound having a siloxane backbone with a functional group (B), and an organic solvent (C), the silver particles (A) having a protective layer containing an amino group-containing compound (a-1) having a boiling point of less than 100° C. and an amino group-containing compound (a-2) having a boiling point of 100° C. or more and having a mean particle size of 1 nm or more and 100 nm or less, the content of the compound (B) being 4% by weight to 8% by weight based on the total amount of the composition.

2. The electroconductive ink composition according to claim 1, wherein the weight ratio of the amino group-containing compound (a-1):the amino group-containing compound (a-2) is in the range of 15:85 to 70:30.

3. The electroconductive ink composition according to claim 1, wherein the functional group of the compound having a siloxane backbone with a functional group (B) is one or more selected from the group consisting of an amino group, an isocyanate group, a cyano group, a vinyl group, an epoxy group, and a mercapto group.

4. The electroconductive ink composition according to claim 1, wherein the organic solvent (C) has a solubility parameter (SP value) of 12 $(cal/cm^3)^{1/2}$ or less.

5. An electroconductive ink composition comprising silver particles (A), a compound having a siloxane backbone with a functional group (B), and an organic solvent (C), the silver particles (A) having a protective layer containing an amino group-containing compound (a-1) having a boiling point of less than 100° C. and an amino group-containing compound (a-2) having a boiling point of 100° C. or more and having a mean particle size of 1 nm or more and 100 nm or less, the content of the compound (B) being 5 parts by weight to 13 parts by weight based on 100 parts by weight of the silver particles (A).

6. A polymer film comprising the electroconductive ink composition according to claim 1, wherein the polymer film is made of a polymer with a glass transition temperature of 100° C. or less.

7. The polymer film according to claim 6, wherein the surface of the polymer film is coated with a ceramic or a metal.

8. A conductive circuit pattern formed using the electroconductive ink composition according to claim 1.

9. The electroconductive ink composition according to claim 2, wherein the weight ratio of the amino group-containing compound (a-1):the amino group-containing compound (a-2) is in the range of 30:70 to 60:40.

10. The electroconductive ink composition according to claim 1, wherein the compound having a siloxane backbone with a functional group (B) is at least one selected from the group consisting of vinyltriethoxysilane and 3-(triethoxysilyl)propylamine, the organic solvent (C) is at least one selected from the group consisting of cyclohexanol, toluene and hexane/2-propanol mixed solvent at the ration of 3/2, the amino group-containing compound (a-1) is n-butylamine and the amino group-containing compound (a-2) is at least one selected from the group consisting of n-dodecylamine and n-octylamine.

11. The electroconductive ink composition according to claim 5, wherein the weight ratio of the amino group-containing compound (a-1):the amino group-containing compound (a-2) is in the range of 15:85 to 70:30.

12. The electroconductive ink composition according to claim 11, wherein the weight ratio of the amino group-containing compound (a-1):the amino group-containing compound (a-2) is in the range of 30:70 to 60:40.

13. The electroconductive ink composition according to claim 5, wherein the functional group of the compound having a siloxane backbone with a functional group (B) is one or more selected from the group consisting of an amino group, an isocyanate group, a cyano group, a vinyl group, an epoxy group, and a mercapto group.

14. The electroconductive ink composition according to claim 5, wherein the organic solvent (C) has a solubility parameter (SP value) of 12 $(cal/cm^3)^{1/2}$ or less.

15. The electroconductive ink composition according to claim 5, wherein the compound having a siloxane backbone with a functional group (B) is at least one selected from the group consisting of vinyltriethoxysilane and 3-(triethoxysilyl)propylamine, the organic solvent (C) is at least one selected from the group consisting of cyclohexanol, toluene and hexane/2-propanol mixed solvent at the ratio of 3/2, the amino group-containing compound (a-1) is n-butylamine and the amino group-containing compound (a-2) is at least one selected from the group consisting of n-dodecylamine and n-octylamine.

16. The electroconductive ink composition according to claim 5, wherein the electroconductive ink composition is for a polymer film made of a polymer with a glass transition temperature of 100° C. or less.

17. The electroconductive ink composition according to claim 16, wherein the surface of the polymer film is coated with a ceramic or a metal.

18. A conductive circuit pattern formed using the electroconductive ink composition according to claim 5.

* * * * *